United States Patent [19]

Waller, Jr.

[11] Patent Number: 4,881,047

[45] Date of Patent: Nov. 14, 1989

[54] AUTOMATIC GAIN EXPANSION SYSTEM

[76] Inventor: James K. Waller, Jr., 174 Morgan Hill, Lake Orion, Mich. 48035

[21] Appl. No.: 209,176

[22] Filed: Jun. 20, 1988

[51] Int. Cl.$^4$ ............................................. H03G 3/30
[52] U.S. Cl. ...................................... 330/282; 330/86; 330/110; 330/136; 330/284
[58] Field of Search ................. 330/86, 110, 145, 136, 330/282, 284; 84/1.19; 381/61

[56] References Cited

U.S. PATENT DOCUMENTS 3,986,049 10/1976 Campbell et al. ............... 330/145 X
4,218,662 8/1980 Schröder .......................... 330/86 X
4,752,960 6/1988 Scholz ................................... 381/61

Primary Examiner—James B. Mullins
Attorney, Agent, or Firm—Frank J. Catalano

[57] ABSTRACT

A system for the high gain amplification of musical audio signals uses a control signal derived from the audio signal to automatically vary the current in the gain control circuit of the amplifier in response to audio signal level changes. A distortion circuit in the feedback path of the amplifier provides controlled distortion. The system may also provide for a variable control signal threshold level and for variation in control signal decay characteristics. The system may further provide a user variable maximum gain control.

25 Claims, 3 Drawing Sheets

AUTOMATIC GAIN EXPANSION SYSTEM

BACKGROUND

This invention relates generally to the amplification of audio signals and more particularly to the amplification of musical instruments.

The desired sound of an instrument amplifier has changed in the past number of years. It has become very desirable to achieve an extremely high gain, overdriven, distorted sound with long sustain, abundant harmonic content and warm, full tonal qualities while avoiding a harsh, raspy characteristic. There are many versions of instrument pre-amplifiers which will produce similar sound qualities. But, when using an amplification factor large enough to produce the desired effect, many noise problems are encountered. Due to the fact that the musical instrument is very low level and generally high impedance, amplified AC line noise (60-50 Hz) and other extraneous signals such as light dimmer interference, radio frequencies and the like become extremely audible. In addition, the musician is faced with the problem of acoustic feedback even at moderate volume levels.

Attempts have been made to solve this problem by the use of noise gates or expander circuits, used either at the input to a high-gain amplifier or pre-amplifier circuit, or after an instrument pre-amplifier. In both cases, the effectiveness is less than desirable and many side effects are encountered.

When a gate or expander is used at the input to a high-gain amplifier, the gate is only effective at removing input noise and will not eliminate the noise of the amplifier circuit itself. When using a gate after a high-gain audio pre-amplifier, other problems are encountered. For example, when the input audio signal is just slightly above the threshold point of operation, or equal to the amplitude of the noise, the noise gate will close and open sporadically when the peak amplitude of the signal exceeds the pre-set threshold point. It is easy to understand that soft passages of guitar music, or virtually any audio source, may have an average signal level equal to the average level of the noise floor. This is where the major flaw of the noise gate is most apparent. Soft passages become nonexistent or pop on and off as the peak amplitude of the input signal exceeds the threshold point.

The use of dynamic noise reduction as described in my U.S. Pat. No. 4,696,044 is a major improvement over the noise gate. But, while circuit noise is reduced, acoustic feedback is somewhat reduced, and the operation of the downward expander virtually eliminates the popping effect encountered with noise gates, other improvements can be made. Line frequency noise and light dimmer interference are still obtrusive when using dynamic noise reduction. It is easy to understand that when an instrument is being played at extremely high levels, saturation of the amplifier is taking place and any audible noise is masked by the audio signal. When the musician plays softly, or stops playing all together, the noise intrusion becomes apparent, especially if the instrument is at full volume. Therefore, the musician must either use a volume control pedal to quickly compensate for the amplification or learn to quickly control the volume control on the instrument itself.

SUMMARY

The present invention provides a high-gain amplification system with dynamically controlled gain to provide high gain when the input level increases, moderate gain at moderate input levels, and low gain at very low input signal levels. Another objective of the invention is to provide a slow, smooth decay of the amplification gain when the input signal decays slowly and a very fast decay when the input signal stops abruptly. Furthermore, this invention provides a variable maximum gain which is user adjustable and allows for high gain saturation of the amplifier circuit. In accordance with the present invention, an automatic gain expansion system is provided in which the input signal is processed by a level detection circuit preferably on an RMS basis to control the gain of the amplification circuit. The gain may be controlled either by use of a variable feedback circuit or through the use of a voltage controlled amplifier at the input gain to the amplification circuit.

BRIEF DESCRIPTION OF THE DRAWINGS

Other objects and advantages of the invention will become apparent upon reading the following detailed description and upon reference to the drawings in which.

DETAILED DESCRIPTION

Figure 1:
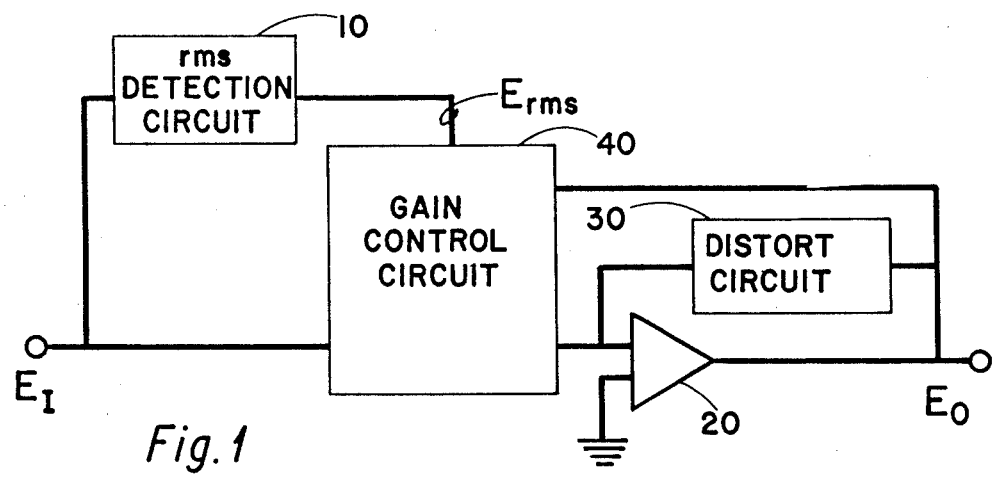
FIG. 1 is a block diagram of the present invention.
Figure 2:
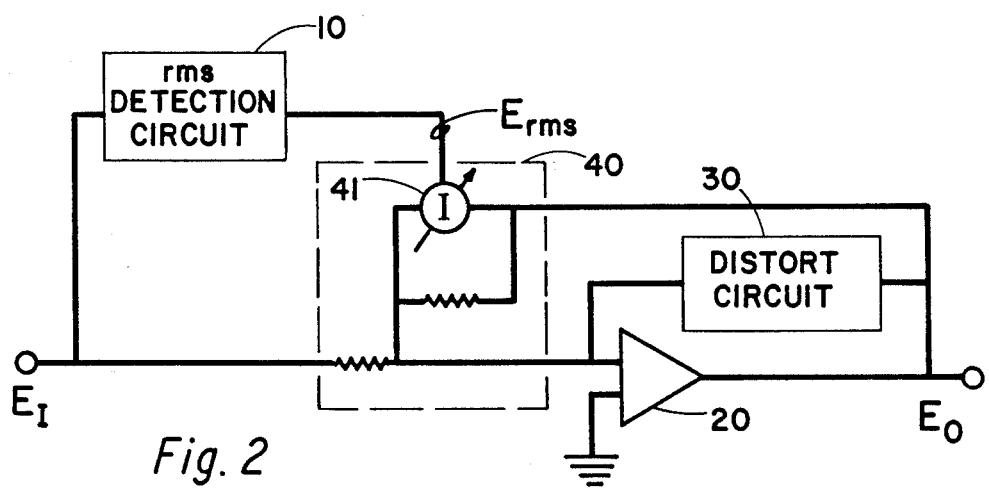
FIG. 2 is a block diagram of a variable feedback embodiment of the present invention.
Figure 3:
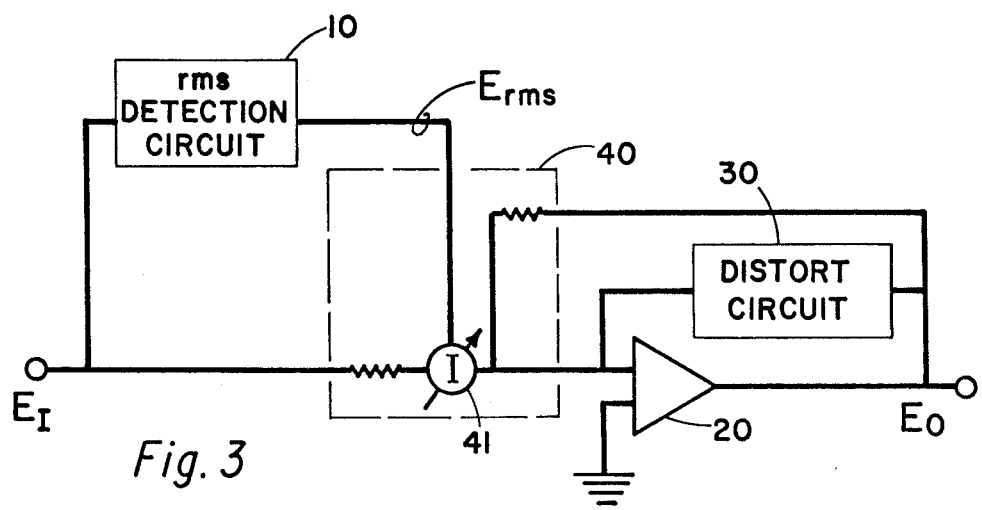
FIG. 3 is a block diagram of a variable input embodiment of the present invention.

An automatic gain expansion system is shown in FIG. 1 consisting of an rms detection circuit 10, a high gain amplifier 20, a distortion circuit 30 and a gain control circuit 40. The input signal $E_I$ is applied to the rms detection circuit 10 to obtain a dc signal $E_{rms}$ responsive to the level of the input signed $E_I$. This dc signal $E_{rms}$ is then used to control a variable current source in the gain control circuit 40. The variable current source 41 may be in the feedback path of the gain control circuit 40, as is shown in FIG. 2, or in the input path of the gain control circuit 40, as is shown in FIG. 3.

Figure 4:
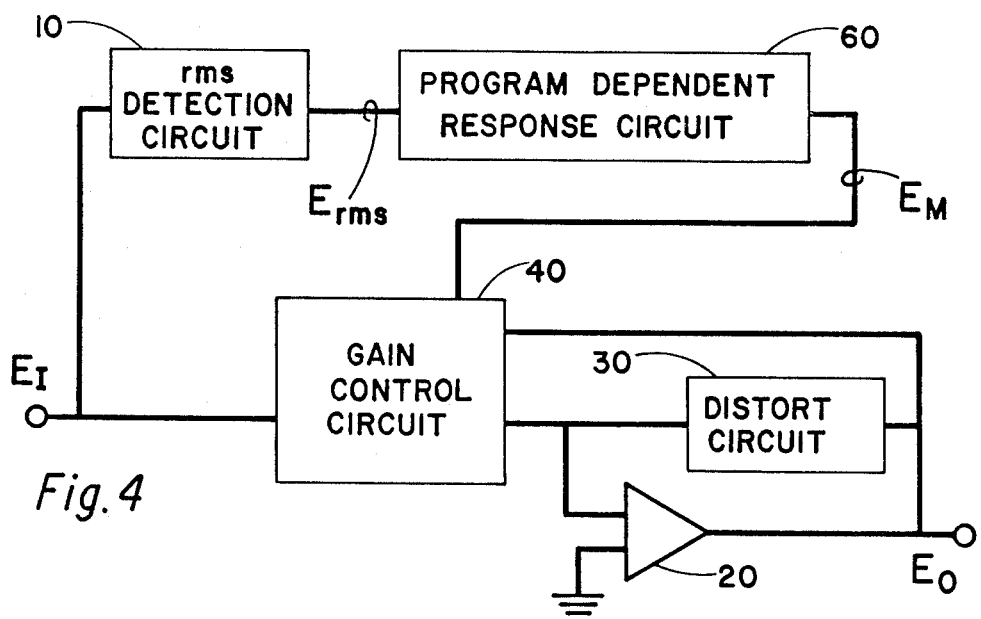
FIG. 4 is a block diagram of a preferred embodiment of the present invention.

The output signal $E_{rms}$ may also be conditioned in a program dependent response circuit 60 to provide a modified control signal $E_m$ to the gain control circuit 40, as is shown in FIG. 4.

The rms detection circuit 10 may be any currently known circuit, such as the one described in my U.S. Pat. No. 4,745,309. The rms detection circuit 10 provides a dc output which is logarithmically related to the input root mean square value. Other forms of detection such as peak or averaging detection may be used with reduced performance results. The response characteristics of the rms circuit should provide very fast attack and release times. Attack and release times of 1 ms or less and 1 to 2 ms respectively are desirable. The release rate of the rms circuit 10 will determine the fast release rate of the variable gain control circuit 40.

Figure 5:
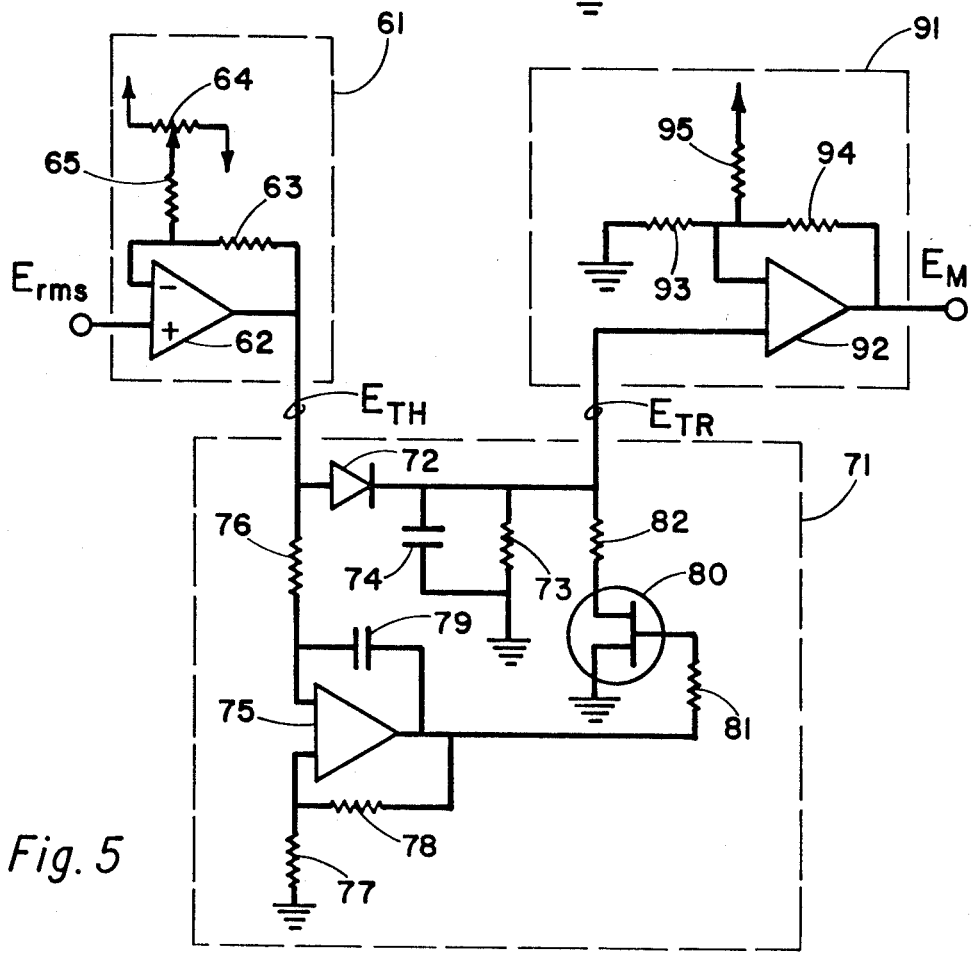
FIG. 5 is a schematic diagram of one embodiment of the program dependent response circuit of the present invention.

A program dependent response circuit 60 is schematically shown in FIG. 5 and a typical system may include some or all of the stages shown, including a threshold stage 61, a time release stage 71, and an operating level stage 91. The output $E_{rms}$ of the rms detection circuit 10 is applied to the threshold stage 61 at the positive input of a differential amplifier 62. The feedback resistor 63 provides feedback for the amplifier. The variable resistor 64 allows a user variable threshold for determining the level of the system. The resistor 65 allows the desired current from the threshold control to be applied to the negative input of the amplifier 62. The output $E_{TH}$ of the amplifier 62 is the difference between the dc voltage at the output of the rms circuit 10 and the setting of the variable threshold 64. This threshold dc voltage $E_{TH}$ is applied to the time release stage 71 at the anode of a diode 72. The cathode of the diode 72 is connected to a timing resistor and capacitor 73 and 74 respectively. In operation, when the dc voltage $E_{TH}$ at the output of the amplifier 62 exceeds 0 Vdc, a dc voltage will appear at the cathode of the diode 72. If the output $E_{TH}$ of the amplifier 62 decreases, the release time of the circuit is determined by the RC time factor of the resistor 73 and the capacitor 74. The output $E_{TH}$ of the amplifier 62 is also applied to the minus input of a comparator 75 through a resistor 76. Another resistor 77 sets the comparator trip point at approximately 0 Vdc. A resistor 78 provides hysteresis which effectively shifts the trip point of the comparator 75. This eliminates the comparator 75 turning on and off as the input voltage passes its threshold point. A capacitor 79 reduces the switching time to further improve stability. The output of the comparator 75 will trip between its high and low saturation points. When the voltage at the output of the comparator 75 is low, a field effect transistor 80 is held off and the release rate is determined by the resistor 73. When the voltage at the output of the comparator 75 is high, bias is applied to the gate of the transistor 80 through a resistor 81 and the release rate is determined primarily by another resistor 82. Thus it can be seen that with a slowly decreasing input level the release time of the program dependent response circuit 60 is very slow. If the input level to the diode 72 should drop below 0 Vdc causing the comparator 75 to switch high, the release rate will be extremely fast due to the resistor 82. This dc timing signal $E_{TR}$ is applied to the operating level stage 91 at the positive input of a differential amplifier 92. The amplifier 92 functions to provide dc gain and dc offset by resistors 93, 94 and 95 to produce the required dc operating level which will be fed to the gain control circuit 40.

Figure 6:
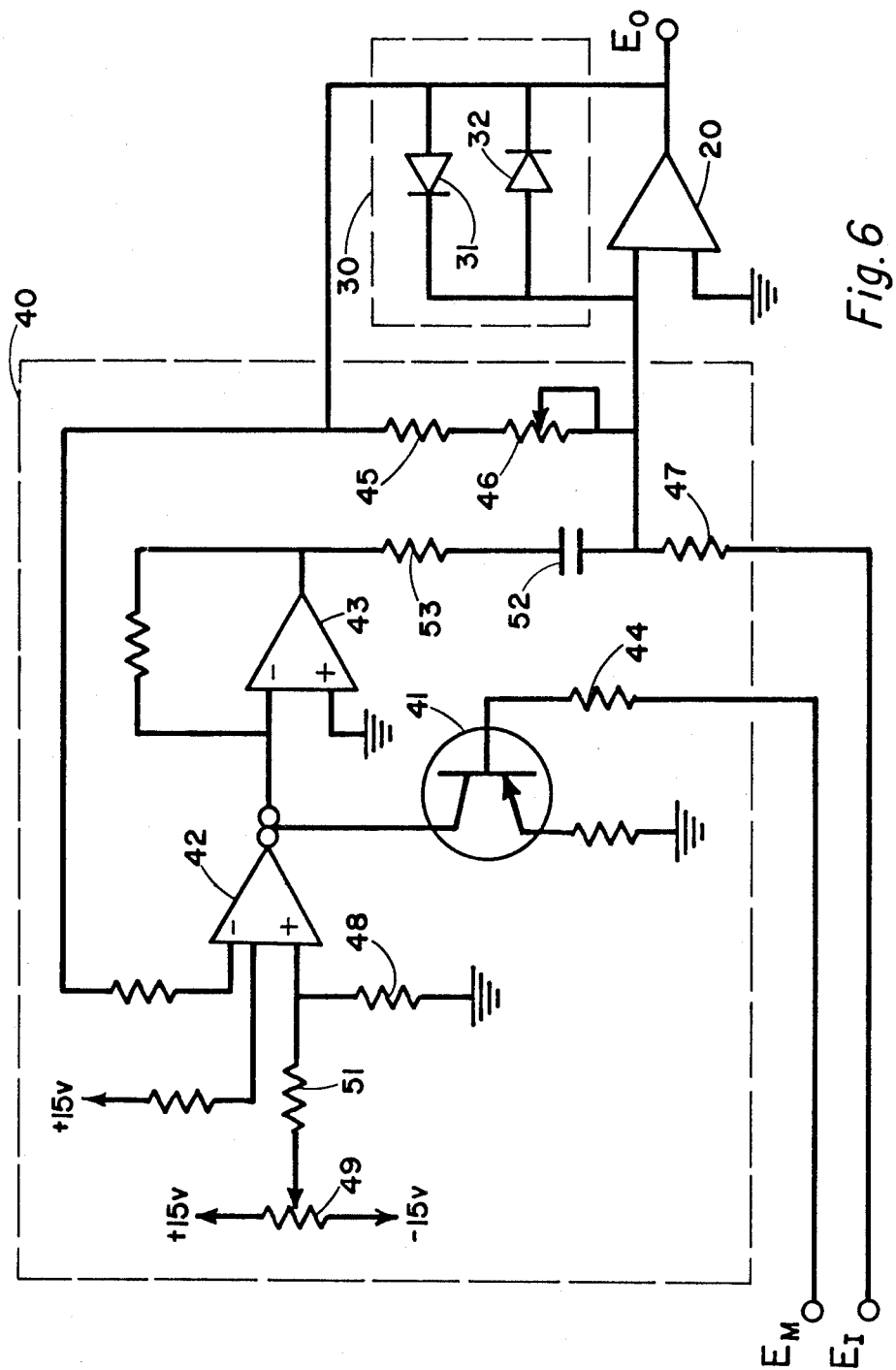
FIG. 6 is a schematic diagram of the gain control circuit of the present invention in a variable feedback embodiment.

A variable feedback embodiment of the gain control circuit 40 is illustrated in FIG. 6. In this embodiment, the circuit 40 consists of the current source transistor 41, an operational transconductance amplifier 42 and a current to voltage inverter 43. The operational transconductance amplifier 42 is effectively in the feedback path of the amplifier 20. The inverting amplifier 43 is required to provide the proper phase signal for feedback. When a positive dc voltage is applied to a resistor 44 by the output $E_M$ of the program dependent response circuit 60, no current will flow from current source 41. Therefore, no output current will appear at the output of the amplifier 42. Thus, the feedback current for the high gain amplifier 20 is provided by resistors 45 and 46 and the distortion circuit 30. The distortion circuit 30 may consist of diodes 31 and 32 in the feedback path to allow controlled distortion to be generated when the output voltage exceeds the diodes' saturation point. So the gain established by the gain control circuit 40 is equal to the sum of resistors 45 and 46 divided by an input resistor 47. The resistor 46 is a user selectable maximum gain setting. When the dc voltage at the output of the program dependent response circuit 60 decreases above 0 Vdc, the current source 41 provides control current to the amplifier 42. Thus feedback current is increased and the gain is reduced. A resistor 48 provides bias for the amplifier 42. A variable resistor 49 and another resistor 51 provide a trim adjustment for the amplifier 42 to eliminate any control signal feedthrough which might appear at the output of the high gain amplifier 20. A capacitor 52 provides AC coupling and a resistor 53 in part determines the final minumum gain setting.

In the variable feedback embodiment shown in FIG. 6, the gain control circuit 40 functions in a fashion to effectively swamp the gain of the high gain amplifier 20. By swamping the gain, a reduction of any quiescent circuit noise from the amplifier 20 results.

In both the variable feedback and the variable input embodiments of the invention shown in FIGS. 2 and 3, the circuit noise of the high gain amplifier 20 is reduced. The variable feedback embodiment of FIGS. 2 and 6 may be implemented with a voltage control amplifier circuit (VCA) in place of the operational transconductance amplifier 42. If so, the requirements for a high quality VCA are somewhat relaxed. A VCA circuit may also be employed in the variable input embodiment of FIG. 3, in which case the VCA circuit effectively sets the gain of the amplifier 20. However, in this configuration the noise performance of the VCA circuit is very critical and a high quality VCA circuit is required for optimal performance.

The invention is designed to provide reduced gain operation. If the input level $E_I$ was so low that it produced no control voltage change at the output $E_M$ of the program dependent response circuit, the amplifier 20 operates in a low gain mode. For example, a gain between input $E_I$ and output $E_O$ might be on the order of 3 to 6 dB. As the input level increases, the dc control voltage applied to the variable gain control circuit 40 would increase and the resulting gain would increase. If a high input level was applied, the dc control voltage would increase to the point where the variable gain control circuit 40 would have virtually no effect. Thus, the gain between the input $E_I$ and the output $E_O$ could be high, perhaps 50 to 60 dB.

It will be apparent to those skilled in the art that many alternatives may be chosen and modifications made in the invention herein described without departing from the scope of the invention. Accordingly, it is intended that the scope of this invention includes all such alternatives and modifications as are apparent from the description or drawings or the appended claims.

What is claimed is:

1. A system for amplifying an input signal comprising:
    means for deriving a dc signal proportional to said input signal;
    means for passing said dc signal when said input signal exceeds a first predetermined level;
    means for amplifying said input signal to produce an output signal;
    means for distorting said output signal when the gain of said amplifying means exceeds a predetermined rate; and means responsive to said passed signal for automatically varying the rate of gain of said amplifying means and for establishing a maximum gain of said amplifying means when said input signal exceeds a second predetermined level.

2. A system for amplifying an input signal comprising:
   means for deriving a dc signal proportional to said input signal;
   means for generating a reference signal of preselected level;
   means for combining said dc signal with said reference signal to produce a control signal;
   means for passing said control signal when said dc signal exceeds said reference signal;
   means for amplifying said input signal to produce an output signal;
   means for distorting said output signal when the gain of said amplifying means exceeds a predetermined rate; and
   means responsive to said passed signal for automatically varying the rate of gain of said amplifying means and for establishing a maximum gain of said amplifying means when said input signal exceeds a second predetermined level.

3. A system for amplifying an input signal comprising:
   means for deriving a dc signal proportional to said input signal;
   means for passing said dc signal when said signal exceeds a first predetermined level;
   means for setting a slow release time of said passed signal;
   means cooperable with said slow release time setting means for setting a rapid release time of said passed signal;
   means for automatically switching said cooperable means into or out of cooperation with said slow release time setting means in response to changes in the level of said dc signal below or above a second predetermined level, respectively, to produce a control signal;
   means for amplifying said input signal to produce an output signal;
   means for distorting said output signal when the gain of said amplifying means exceeds a predetermined rate; and
   means responsive to said control signal for automatically varying the rate of gain of said amplifying means.

4. A system for amplifying an input signal comprising:
   means for deriving a dc signal proportional to said input signal;
   means for generating a reference signal of variably selectable level;
   means for combining said dc signal with said reference signal to produce a first control signal;
   means for passing said first control signal when said dc signal exceeds said reference signal;
   means for setting a slow release time of said passed signal;
   means cooperable with said slow release time setting means for setting a rapid release time of said passed signal;
   means for automatically switching said cooperable means into or out of cooperating with said slow release time setting means in response to changes in the level of said first control signal below or above a predetermined level, respectively, to produce a second control signal;
   means for amplifying said input signal to produce an output signal;
   means for distorting said output signal when the gain of said amplifying means exceeds a predetermined rate; and
   means responsive to said second control signal for automatically varying the rate of gain of said amplifying means.

5. A system for amplifying an input signal comprising:
   means for deriving from said input signal a dc signal directly proportional to the logarithm of said input signal;
   means for generating a first reference signal of variably selectable level;
   means for combining said dc signal with said first reference signal to produce a first control signal;
   means for passing said first control signal when said dc signal exceeds said first reference signal and for blocking said first control signal when said dc signal falls below said first reference signal;
   means for automatically switching the release time of said passed signal in response to the level of said first control signal to produce a second control signal;
   means for high gain amplifying said input signal to produce an output signal;
   means for distorting said output signal when the gain of said amplifying means exceeds a predetermined rate;
   means for setting the maximum gain of said amplifying means; and
   means responsive to said second control signal and cooperable with said setting means for automatically varying the gain of said amplifying means.

6. A system for amplifying an input signal comprising:
   means for deriving from said input signal a dc signal directly proportional to the logarithm of said input signal;
   means for generating a first reference signal of variably selectable level;
   means for combining said dc signal with said first reference signal to produce a first control signal;
   means for passing said first control signal when said dc signal exceeds said first reference signal and for blocking said first control signal when said dc signal falls below said first reference signal;
   means for automatically switching the release time of said passing signal in response to the level of said first control signal to produce a second control signal;
   means for generating a preset reference signal;
   means for combining said second control signal with said preset reference signal to produce a modified control signal;
   means for high gain amplifying said input signal to produce an output signal;
   means for distorting said output signal when the gain of said amplifying means exceeds a predetermined rate;
   means for setting the maximum gain of said amplifying means; and means responsive to said modified control signal and cooperable with said setting means for automatically varying the gain of said amplifying means.

7. A system for amplifying an input signal comprising:
  means for deriving from said input signal a dc signal directly proportional to the logarithm of said input signal;
  means for generating a first reference signal of variably selectable level;
  means for combining said dc signal with said first reference signal to produce a first control signal;
  means for passing said first control signal when said dc signal exceeds said first reference signal and for blocking said first control signal when said dc signal falls below said reference signal;
  means for setting a slow release time of said passed signal;
  means cooperable with said slow release time setting means for setting a rapid release time of said passed signal;
  means for automatically switching said cooperable means into or out of cooperation with said slow release time setting means in response to changes in the level of said first control signal below or above a predetermined level, respectively, to produce a second control signal;
  means for generating a second reference signal of variably selectable level;
  means for combining said second control signal with said second reference signal to produce a modified control signal;
  means for high gain amplifying said input signal to produce an output signal;
  means for distorting said output signal when the gain of said amplifying means exceeds a predetermined rate;
  means for setting the maximum gain of said amplifying means; and
  means responsive to said modified control signal and cooperable with said maximum gain setting means for automatically varying the gain of said amplifying means.

8. A system for amplifying an input signal comprising:
  means for deriving a dc control signal proportional to said input signal;
  means for passing said dc signal when said input signal exceeds a first predetermined level;
  means for amplifying said input signal to produce an output signal;
  means for distorting said output signal when the gain of said amplifying means exceeds a predetermined rate;
  means in a first feedback path of said amplifying means for setting the maximum gain of said amplifying means when said input signal exceeds a second predetermined level;
  means in a second feedback path of said amplifying means responsive to said passed signal and cooperable with said means in said first feedback path for automatically varying the gain of said amplifying means.

9. A system for amplifying an input signal comprising:
  means for deriving a dc control signal proportional to said input signal;
  means for passing said dc signal when said input signal exceeds a first predetermined level;
  means for amplifying said input signal to produce an output signal;
  means for distorting said output signal when the gain of said amplifying means exceeds a predetermined rate;
  means in a feedback path of said amplifying means for setting the maximum gain of said amplifying means when said input signal exceeds a second predetermined level;
  means in an input path of said amplifying means responsive to said passed signal and cooperable with said feedback path means for automatically varying the gain of said amplifying means.

10. The system according to claims 8 or 9, said control signal deriving means comprising:
  means for deriving an rms signal from said input signal;
  means for generating a reference signal of preselected level; and
  means for combining said rms signal with said reference signal to provide a dc control signal.

11. The system according to claims 8 or 9, said control signal deriving means comprising:
  means for deriving an rms signal from said input signal;
  means for passing said rms signal when said signal exceeds a first predetermined level;
  means for setting a slow release time of said passed signal;
  means cooperable with said slow release time setting means for setting a rapid release time of said passed signal; and
  means for automatically switching said cooperable means into or out of cooperation with said slow release time setting means in response to changes in the level of said passed signal below or above a second predetermined level respectively to produce a dc control signal.

12. The system according to claim 8 or 9 further comprising means in a parallel feedback path of said amplifying means for setting the maximum gain of said amplifying means.

13. The system according to claims 8 or 9, said control signal deriving means comprising:
  means for deriving an rms signal from said input signal;
  means for generating a reference signal of preselected level;
  means for combining said rms signal with said reference signal;
  means for passing said combined signal when said signal exceeds a first predetermined level;
  means for setting a slow release time of said passed signal;
  means cooperable with said slow release time setting means for setting a rapid release time of said passed signal; and
  means for automatically switching said cooperable means into or out of cooperation with said slow release time setting means in response to changes in the level of said passed signal below or above a second predetermined level, respectively, to provide a dc control signal.

14. The system according to claim 8 or 9, said dc control signal means comprising:

means for deriving an rms signal from said input signal;
means for generating a first reference signal of preselected level;
means for combining said rms signal with said first reference signal;
means for passing said combined signal when said signal exceeds a first predetermined level;
means for setting a slow release time of said passed signal;
means cooperable with said slow release time setting means for setting a rapid release time of said passed signal;
means for automatically switching said cooperable means into or out of cooperation with said slow release time setting means in response to changes in the level of said combined signal below or above a second predetermined level, respectively to provide a variably time released signal;
means for generating a second reference signal; and
means for combining said variably time released signal with said second reference signal to produce a dc control signal.

15. A method for variable high gain amplification of an input signal comprising the steps of:
deriving a dc control signal from said input signal;
passing said dc control signal when said input signal exceeds a first determined level;
amplifying said input signal to produce an output signal;
distorting said output signal when the gain exceeds a predetermined rate;
automatically varying the rate of gain in response to said dc control signal; and
fixing a maximum gain when said input signal exceeds a second predetermined level.

16. The method according to claim 15 where in said step of deriving a dc control signal comprises the steps of:
detecting the rms value of said input signal;
generating a reference signal of preselected level; and
combining said rms signal and said reference signal.

17. The method according to claim 16 wherein said step of deriving a dc control signal further comprises the steps of:
sensing the level of said combined signal; and
decaying said passed signal slowly when said combined signal decays slowly and quickly when said combined signal decays abruptly.

18. The method according to claim 17 wherein said step of deriving a dc control signal further comprises the steps of:
generating a second reference signal of preselected level; and
combining said decayed signal with said second reference signal.

19. The method according to claim 15 further comprising the step of variably setting the maximum rate of gain.

20. The method according to claim 15 wherein said step of automatically varying the rate of gain comprises the steps of:
sensing the level of said dc control signal; and
varying the input current to the amplifier in response to the sensed level of said dc control signal.

21. The method according to claim 15 wherein said step of automatically varying the rate of gain comprises the steps of:
sensing the level of said dc control signal; and
varying the feedback current of the amplifier in response to the sensed level of said dc control signal.

22. A method for variable high gain amplification of an input signal comprising the steps of:
detecting the rms value of said input signal;
generating a reference signal of preselected level;
combining said rms signal and said reference signal;
passing said combined signal;
sensing the level of said combined signal;
decaying said passed signal slowly when said combined signal decays slowly and quickly when said combined signed decays abruptly;
generating a second reference signal of preselected level;
combining said decayed signal with said second reference signal to produce a dc control signal;
amplifying said input signal to produce an output signal;
distorting said output signal when the gain exceeds a predetermined rate;
variably setting the maximum rate of gain;
sensing the level of said dc control signal; and
varying the input current to the amplifier in response to the sensed level of said dc control signal.

23. A method for variable high gain amplification of an input signal comprising the steps of:
detecting the rms value of said input signal;
generating a reference signal of preselected level;
combining said rms signal and said reference signal;
passing said combined signal;
sensing the level of said combined signal;
decaying said passed signal slowly when said combined signal decays slowly and quickly when said combined signal decays abruptly;
generating a second reference signal of preselected level;
combining said decayed signal with said second reference signal to produce a dc control signal;
amplifying said input signal to produce an output signal;
distorting said output signal when the gain exceeds a predetermined rate;
variably setting the maximum rate of gain;
sensing the level of said dc control signal; and
varying the feedback current of the amplifier in response to the sensed level of said dc control signal.

24. A system for amplifying an input signal comprising:
means for deriving a dc signal proportional to said input signal;
means for passing said dc signal when said signal exceeds a first predetermined level;
means for setting a slow release time of said passed signal;
means cooperable with said slow release time setting means for setting a rapid release time of said passed signal;
means for automatically switching said cooperable means into or out of cooperation with said slow release time setting means in response to changes in the level of said dc signal below or above a second predetermined level, respectively, to produce a control signal;
means for amplifying said input signal to produce an output signal;

means for distorting said output signal when the gain of said amplifying means exceeds a predetermined rate; and means responsive to said control signal for automatically varying the rate of gain of said amplifying means and for establishing a maximum gain of said amplifying means when said dc signal exceeds a third predetermined level.

25. A system for amplifying an input signal comprising:

means for deriving a dc signal proportional to said input signal;

means for generating a reference signal of variably selectable level;

means for combining said dc signal with said reference signal to produce a first control signal;

means for passing said first control signal when said dc signal exceeds said reference signal;

means for setting a slow release time of said passed signal;

means cooperable with said slow release time setting means for selecting a rapid release time of said passed signal;

means for automatically switching said cooperable means into or out of cooperation with said slow release time setting means in response to changes in the level of said first control signal below or above a first predetermined level, respectively, to produce a second control signal;

means for amplifying said input signal to produce an output signal;

means for distorting said output signal when the gain of said amplifying means exceeds a predetermined rate; and means responsive to said second control signal for automatically varying the rate of gain of said amplifying means and for establishing a maximum gain of said amplifying means when said first control signal exceeds a second predetermined level.

* * * * *